(12) United States Patent
Bryant et al.

(10) Patent No.: US 7,947,427 B2
(45) Date of Patent: *May 24, 2011

(54) PRINTING ELEMENT WITH AN INTEGRATED PRINTING SURFACE

(76) Inventors: Laurie A. Bryant, Douglasville, GA (US); Jonghan Choi, Smyrna, GA (US); Ryan Vest, Cumming, GA (US)

( * ) Notice: Subject to any disclaimer, the term of this patent is extended or adjusted under 35 U.S.C. 154(b) by 134 days.

This patent is subject to a terminal disclaimer.

(21) Appl. No.: 12/469,721

(22) Filed: May 21, 2009

(65) Prior Publication Data

US 2009/0226845 A1    Sep. 10, 2009

Related U.S. Application Data

(63) Continuation of application No. 11/150,088, filed on Jun. 9, 2005, now abandoned.

(51) Int. Cl.
*G03F 7/00* (2006.01)
*G03F 7/26* (2006.01)

(52) U.S. Cl. .................. 430/306; 430/273.1; 430/329; 430/138; 705/7

(58) Field of Classification Search .......... 430/270.1, 430/306

See application file for complete search history.

(56) References Cited

U.S. PATENT DOCUMENTS

| | | |
|---|---|---|
| 3,264,103 A | 8/1966 | Cohen et al. |
| 4,045,231 A | 8/1977 | Toda et al. |
| 4,323,636 A | 4/1982 | Chen |
| 4,869,997 A | 9/1989 | Koch et al. |
| 5,175,072 A | 12/1992 | Martens |
| 5,223,375 A | 6/1993 | Berrier et al. |
| 5,279,697 A | 1/1994 | Peterson et al. |
| 5,290,633 A | 3/1994 | Devlin et al. |
| 5,534,391 A | 7/1996 | Wang |
| 5,760,880 A | 6/1998 | Fan et al. |
| 5,888,701 A | 3/1999 | Fan |
| 5,894,799 A | 4/1999 | Bart et al. |
| 5,916,403 A | 6/1999 | Cushner et al. |
| 5,962,111 A | 10/1999 | Rach |
| 6,159,659 A | 12/2000 | Gelbart |
| 6,238,837 B1 | 5/2001 | Fan |
| 6,247,403 B1 | 6/2001 | Randazzo |
| 6,605,410 B2 | 8/2003 | Yang et al. |
| 6,797,454 B1 | 9/2004 | Johnson et al. |
| 6,846,075 B2 | 1/2005 | Ylitalo et al. |
| 6,966,259 B2 | 11/2005 | Kanga et al. |
| 7,081,331 B2 * | 7/2006 | Vest .............................. 430/302 |
| 2003/0054153 A1* | 3/2003 | Kuczynski et al. ........ 428/304.4 |
| 2003/0180655 A1 | 9/2003 | Fan et al. |
| 2003/0211423 A1 | 11/2003 | Mengel et al. |
| 2004/0258856 A1 | 12/2004 | Ylitalo et al. |

FOREIGN PATENT DOCUMENTS

EP     1 239 329     9/2002

(Continued)

*Primary Examiner* — Cynthia H Kelly
*Assistant Examiner* — Chanceity Robinson
(74) *Attorney, Agent, or Firm* — Carmody & Torrance LLP

(57) ABSTRACT

A relief image printing element with an integral imageable printing surface and a method of preparing the relief image printing element are described. The relief image printing element comprises a dimensionally stable base layer; a floor layer comprised of a cured polymer selected from the group consisting of photopolymers, and polymers with a resilience of at least 40% when cured; and at least one layer of an imageable material. Most preferably, the floor layer created by curing the layer through the top of the printing element by face exposure. The printing element may also contain a compressible layer between the base layer and the floor layer.

6 Claims, 1 Drawing Sheet

FOREIGN PATENT DOCUMENTS

| | | |
|---|---|---|
| WO | 93/23253 | 11/1993 |
| WO | 01/18604 | 3/2001 |
| WO | 01/88615 | 11/2001 |
| WO | WO 01/88615 | * 11/2001 |
| WO | 2005/070690 | 8/2005 |
| WO | 2006/055068 | 5/2006 |

* cited by examiner

PRINTING ELEMENT WITH AN INTEGRATED PRINTING SURFACE

This application is a continuation of U.S. application Ser. No. 11/150,088, filed Jun. 9, 2005, now abandoned, which is herein incorporated by reference in its entirety.

FIELD OF THE INVENTION

The invention reveals an improved relief image printing element, which has a pre-formed floor layer and an integral imageable surface thereon.

BACKGROUND OF THE INVENTION

Flexography is a method of printing that is commonly used for high-volume runs. Flexography is employed for printing on a variety of substrates such as paper, paperboard stock, corrugated board, films, foils and laminates. Newspapers and grocery bags are prominent examples. Coarse surfaces and stretch films can be economically printed only by means of flexography. Flexographic printing plates are relief plates with image elements raised above open areas. Such plates offer a number of advantages to the printer, based chiefly on their durability and the ease with which they can be made.

Although photopolymer printing elements are typically used in "flat" sheet form, there are particular applications and advantages to using the printing element in a continuous cylindrical form, as a continuous in-the-round (CITR) photopolymer sleeve. CITR photopolymer sleeves add the benefits of digital imaging, accurate registration, fast mounting, and no plate lift to the flexographic printing process. CITR sleeves have applications in the flexographic printing of continuous designs such as in wallpaper, decoration and giftwrapping paper, and other continuous designs such as tablecloths, etc. CITR sleeves enable flexographic printing to be more competitive with gravure and offset on print quality.

A typical flexographic printing plate as delivered by its manufacturer, is a multilayered article made of, in order, a backing or support layer, one or more unexposed photocurable layers, a protective layer or slip film, and a cover sheet. A typical CITR photopolymer sleeve generally comprises a sleeve carrier (support layer) and at least one unexposed photocurable layer on top of the support layer.

A flexographic printing element is produced from a photocurable printing blank by imaging the photocurable printing blank to produce a relief image on the surface of the printing element. This is generally accomplished by selectively exposing the photocurable material to actinic radiation, which exposure acts to harden or crosslink the photocurable material in the irradiated areas.

The photocurable printing blank typically contains one or more layers of an uncured photocurable material on a suitable backing layer. The photocurable printing blank can be in the form of either a flat, planar element or as a cylindrical printing element.

The printing element is selectively exposed to actinic radiation in one of three related ways. In the first alternative, a photographic negative with transparent areas and substantially opaque areas is used to selectively block the transmission of actinic radiation to the printing plate element. In the second alternative, the photopolymer layer is coated with an actinic radiation (substantially) opaque layer, which is also sensitive to laser ablation. A laser is then used to ablate selected areas of the actinic radiation opaque layer creating an in situ negative. The printing element is then flood exposed through the in situ negative. In the third alternative, a focused beam of actinic radiation is used to selectively expose the photopolymer. Any of these alternative methods is acceptable, with the criteria being the ability to selectively expose the photopolymer to actinic radiation thereby selectively curing portions of the photopolymer.

Thereafter, the imaged and exposed printing element is developed to remove uncured photopolymer on the surface of the printing element and thus reveal the relief image. Development may be accomplished in a variety of ways, including water washing, solvent washing, using an air knife, and thermally, e.g., "blotting."

Finally, following development, the photopolymer layer may be post-exposed to actinic radiation to provide a more complete cure for the photopolymer layer of the invention and thus a more durable printing plate. The photopolymer layer may also be subjected to a detackification step.

Historically, in flexographic printing, flat, flexible printing plates, fabricated from photopolymers, were hand mounted onto print cylinders by wrapping the printing plate around the cylinder and adhering it there with using various methods such as clamps, tape, magnets or other similar devices. This process works well, but is labor intensive and great care must be taken to ensure that the registration of the plate on the cylinder is accurate. In addition, to allow for additional compression during the print process, a compressible material may be inserted between the print cylinder and the printing plate. A refinement of this process provides for a compressible layer to be contained within the flexographic printing plates Furthermore, a floor layer, which sets the depth of relief in the photocurable layer, has traditionally been provided in the printing element by back exposing the photocurable layer through the backing layer to create a cured "floor" within the photocurable layer. However, especially in thin plate technologies, back exposure variance can be a problem, resulting in inconsistent imaging results that hold varying degrees of detail with the plate. A further concern is that back exposure is an additional processing step taking additional time to complete. Thus it would be highly desirable to provide a floor layer in a flexographic printing element in a more consistent manner.

U.S. Pat. No. 5,962,111 to Rach, the subject matter of which is herein incorporated by reference in its entirety, describes a compressible printing plate formed by casting liquid photopolymerizable resin directly onto a compressible material. The photopolymerizable resin is then incompletely cured by exposure to actinic radiation. However, Rach only incompletely cures the photopolymerizable resin to create the floor layer and does not address the issue of back exposure variance.

The inventors of the present invention have determined that an improved printing element can be formed with an optional compressible layer and an integral floor layer that provides a more consistent printing element than that of the prior art.

A key advantage of the present invention is that back exposure is no longer required, thus eliminating problems resulting from back exposure variance. Furthermore, there is an obvious time savings resulting from not requiring the back exposure step.

Poor or inconsistent control of light transmittance through the polymer during back exposure can result in the degradation of reverse images, filling them in when compounded with the face exposure sequence. In this instant invention, only face exposure is needed, so the issue of pre-sensitized material or partially cured material during the back exposure sequence causing image degradation is eliminated, resulting in enhanced imaging of the top layer.

Another key benefit of the present invention is the ability to vary the composition of the photocurable layer, provided there is good adhesion between the layers, in order to affect different print attributes, in a manner similar to the way high density and low density foam can affect printing today. A high durometer base, low durometer base, various combinations of the two with the top layer, and even compressible layers (e.g., microspheres embedded with a styrene-isoprene-styrene/styrene-butadiene-styrene copolymer matrix) can be formulated for good compatibility with the surface layer.

The printing plate compositions of the invention can also be formulated to have an extremely fast curing top layer, without concerns for the back exposure sequence being inconsistent. In addition, the front exposure time can be shortened, hold more detail, compounded by the enhanced imaging benefits resulting from the use of a front exposure-only system.

The improved printing elements of the invention also have reduced cold flow in thicker gauges. Higher thickness materials can flow over time, creating havoc in plates sticking to each other during transport (worst case scenario) or small areas of thinner calipers in the plate may stick together after processing, either of which can hurt the print quality.

Finally, printing elements of the invention can be developed such that the top layer itself is one layer or two and may be either analog or digital. The floor can also be formulated to have reduced surface tension properties, aiding in plate clean up.

Finally, exposure of the floor layer through the face and subsequent grinding, sanding, etc. to achieve the specification has been found to be advantageous. Moreover, using this step achieved high adhesion to the base layer surface without the use of primers/adhesives normally used in the art.

In the past, as noted herein, the manufacturers of printing plates formed those printing plates by starting with a sheet of photopolymer laminated to a stable base layer of strong polymer resin, such as polyester. The printing plate manufacturer then partially U.V. exposed the bottom face of the photopolymer through the stable base layer to form a cured floor layer of photopolymer. The top face of the photopolymer layer was then imagewise exposed to U.V. in order to create the relief desired. Thus printing plate manufacturers were forced to use at least two U.V. exposures to create the printing plate, a back exposure to create the floor and a frontal imagewise exposure to create the desired imagewise relief structure. The back exposure is troublesome from at least two points of view. First it is a separate manufacturing step. Second, because of variability in the U.V. transparency of the stable base layer and the need to expose through this layer, non-uniformity in curing the floor layer and variations in floor layer thickness were experienced.

The practice of this invention allows for the use of a new business practice, namely supplying printing plate manufacturers with solid sheet photopolymer with a pre-cured floor layer. This allows the printing plate manufacturer to skip the back exposure step and allows for a more uniform and exacting floor layer to be formed.

SUMMARY OF THE INVENTION

The present invention is directed to an improved relief image printing element with an integral imageable printing surface. The improved relief image printing element of the invention comprises the following elements:

a. a dimensionally stable base layer;
b. a floor layer comprised of a cured polymer selected from the group consisting of photopolymers, and polymers with a resilience of at least 40% when cured; and
c. at least one layer of an imageable material.

Optionally, but preferably, the printing element of the invention may also comprise a layer of compressible material between the dimensionally stable base layer and the floor layer.

In addition, the relief image printing element may also comprise a masking layer on top of the at least one layer of imageable material. Finally, the printing element may comprise a removable coversheet on top of the at least one layer of imageable material or the on top of the masking layer (if used).

A method of making the improved printing element of the invention is also provided. The method generally comprises the steps of:

a. providing a dimensionally stable base layer;
b. applying a floor layer comprised of a polymer selected from the group consisting of photopolymers, and polymers with a resilience of at least 40% when cured over the dimensionally stable base layer;
c. curing the floor layer;
d. applying at least one imageable layer on top of the cured floor layer;
e. optionally, applying a masking layer on top of the imageable layer; and
f. optionally, applying a removable coversheet over the at least one imageable layer or the optional masking layer.

BRIEF DESCRIPTION OF THE DRAWING

The following is a brief description of the drawing which should be read in conjunction with the detailed description of the invention.

DETAILED DESCRIPTION OF THE INVENTION

Figure 1:
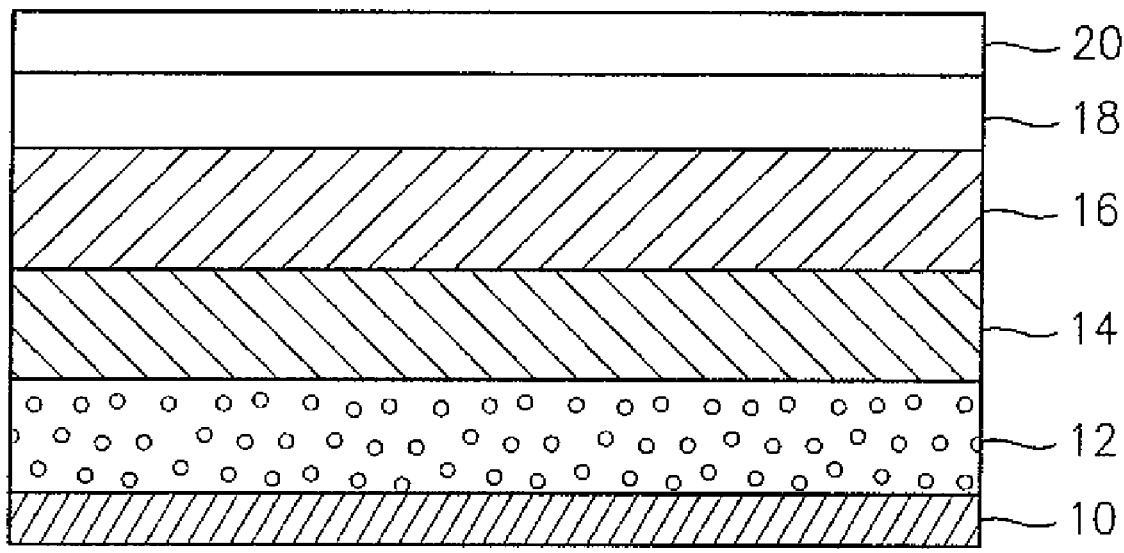
FIG. 1 illustrates a cross section of one embodiment of the relief image printing element of the present invention.

The present invention is directed to an improved relief image printing element with an integral imageable printing surface. The improved relief image printing element of the invention comprises the following elements.

(1) a dimensionally stable base layer 10 made of a high strength polymer resin, which is optionally fiber reinforced;
(2) optionally, but preferably, a layer of compressible material 12;
(3) a floor layer 14 comprised of a layer of photopolymerized photopolymer or other polymerized resilient material. Optionally, layers 12 and 14 may be one and the same layer;
(4) an imageable layer 16 comprised of at least one layer of an imageable (preferably, photoimageable) material;
(5) optionally, a masking layer 18 which absorbs radiation at the wavelengths used to polymerize the photoimageable material but is selectively removable by laser ablation or other equivalent means; and
(6) optionally, a removable coversheet 20.

Thus in practicing this invention, a supplier of photopolymer, particularly solid sheet photopolymer, to the printing plate industry can supply the foregoing printing element with a pre-cured floor layer to the manufacturer of printing plates. The floor would be pre-cured by the photopolymer supplier to the specifications of the printing plate manufacturer as to thickness, resilience and hardness. The pre-curing of the floor can most efficiently be done by the photopolymer supplier through frontal face exposure prior to the application of the imageable layer, thus eliminating the need for back exposure and the quality variations caused thereby. Upon receipt of the printing plate element of this invention, the printing plate manufacturer is merely required to imagewise expose the imageable layer (possibly through a mask or the selectively ablated masking layer) and then develop away the uncured photopolymer to create the relief image.

The dimensionally stable base layer 10 can be fabricated using the materials and methods applicable to producing printing elements of the prior art. However, it is preferred that dimensionally stable base layer 10 be fabricated from a polymer resin reinforced with a fibrous material.

The fibrous material typically contains fibers of glass, carbon, metal, ceramic, aramid or any other synthetic long fibers that increase the stability, stiffness, and rigidity of the base layer 10. Preferably, the fibrous material is a fiberglass cloth. The fibrous material content of the base layer 10 is preferably from about 20 to about 70 by weight.

Preferred resins useful in fabricating the base layer 10 include polyester resins, phenolic resins and epoxy resins, with epoxy resins being most preferred. Suitable resins include the following commercially available resins: Epoxical resin and Epoxical hardener from Epoxical Inc, of Minnesota and other Epoxy resins from JeffCo and Bakelite, Augusta, Ga. In one embodiment, the base layer 10 is substantially uniformly transparent or translucent such that actinic radiation can be transmitted through the surface of the base layer 10 to the imageable layer 16.

One preferred method of fabricating the base layer 10 is to directly cast the resin and fibrous material to form the required base layer thickness. The base layer 10 is then cured using heat, actinic radiation, and/or radiant energy. The base layer 10 is finished to specification by being sanded, ground or otherwise machined to size. The base layer 10 typically ranges from about 10 mils to 100 mils in thickness.

Once base layer 10 is fabricated, a layer of compressible material 12 is optionally, but preferably applied to the top surface of base layer 10. The compressible layer can take a number of forms. In one embodiment, the compressible material 12 consists of a layer of solid foam material, which is adhesively bonded to the top surface of the base layer 10. Alternatively, and preferably, the layer of compressible material 12 may be formed by uniformly mixing hollow microspheres with an uncured photocurable or thermally curable resin formulation. The resin/microsphere mixture is then applied to base 10 in a layer or layers using a knife or extrusion to provide uniform thickness. The resin microsphere layer is cured using heat, actinic radiation, and/or radiant energy as appropriate. Preferably, electron beam curing is advantageously used for curing the microsphere compressible foam layer. In a third alternative, a soft resilient polymer such as a polyurethane, or softer version of the Styrene-isoprene-styrene or styrene-butadiene-styrene photocurable layer may be used as the compressible material. In this case, the uncured material is similarly applied using a knife or extrusion to ensure uniform thickness and then cured in place. After application and photocuring, the compressible layer is preferably further grounded or sanded to achieve the desired thickness.

The thickness of the layer of compressible material can vary depending upon the material being used and the particular printing application. Generally, if a layer of compressible material is used, the thickness of the layer may range from about 20 mils to 40 mils. This thickness of the compressible layer assures wide latitude of approximately 20 mils impression during the printing without significant dot gain. The cured layer of compressible material can be sanded, ground, or otherwise machined to specification.

Next, whether or not the layer of compressible material 12 is used, a floor layer 14 comprised of one or more layers of photopolymer or other resilient polymeric material is applied to the top surface of base layer 10 or, if used, to the top surface of the layer of compressible material 12. It is entirely possible that the compressible layer 12 and the floor layer 14 are one and the same. If the floor 14 and compressible 12 layers are the same, microspheres are preferably included in the polymer/photopolymer composition to increase its compressibility. In a preferred embodiment, the floor layer 14 comprises a photopolymer, which is subsequently cured before the imageable layer 16 is applied. The photocuring of the floor layer 14 is achieved by face exposure of the floor layer 14 to actinic radiation for a certain length of time through the front. The floor layer 14, after curing, is preferably sanded, ground, or otherwise machined to specification.

The floor layer 14 is preferably applied as a liquid extrudate polymer, using a knife or extrusion to ensure uniform thickness. Once applied, the layer is cured preferably from the front using heat, actinic radiation and/or radiant energy to form a substantially continuous layer over the top of base layer 10 or compressible layer 12 if used. If necessary, the floor layer 14 can then be sanded, ground or otherwise machined to the proper thickness. The thickness of the floor layer may range from about 5 mils to about 134 mils. When cured, the floor layer 14, depending on the thickness and type of photopolymer, should have a resilience of from 40% to 70% and a hardness of from 30 to 70 Shore A as measured by ASTM D2240.

The purpose of the floor layer 14 is to ensure that the imageable layer 16 has excellent adhesion and remains firmly attached to the base layer 10 or optional compressible layer 12, even when very fine isolated structures are developed in the imageable layer 16. The floor layer 14 also gives physical support to fine dots and lines during the printing process. This is especially critical for constructions where the total thickness of the imageable photopolymer 16 and floor 14 layers is relatively thin (~28-30 mil total). The floor layer 14 as used herein, with face exposure from the front, also assures extreme uniformity of the relief layer, which is necessary for high-end printing applications where floor variation can create degradation of image fidelity. Also, since the floor layer 14 can be completely cured from the front it assures a very dry surface after the processing step and post-exposure/detack steps. It is also preferable for the floor layer 14 to comprise the same photopolymer as is present in the imageable layer 16. Moreover, it is important for the floor layer 14 to exhibit good adhesion to the layer below and to the imageable layer 16. In this regard, photocurable styrenic block copolymers generally work well in providing an adequate floor layer.

Imageable layer 16 is formed from a material which can be imaged, either mechanically, optically, via heat or differential melting and/or chemically. Preferably, imageable layer 16 comprises a photocurable or photopolymerizable material. Typically, the photocurable material is applied to the floor layer 14 by spreading, dipping, casting, extruding or molding. The thickness is controlled either by using a knife, die or mold as appropriate. If necessary, the precise thickness of imageable layer 16 can be adjusted via grinding, sanding or other machining. If desired, more than one imageable layer can be sequentially applied.

The photocurable material for use in fabricating the floor layer 14 and the imageable layer 16 generally comprises binder(s), monomer(s) and photoinitiator(s). The binder preferably comprises an A-B-A type block copolymer where A represents a non-elastomeric block, preferably a vinyl polymer or most preferably polystyrene, and B represents an elastomeric block, preferably polybutadiene or polyisoprene. Preferably, the non-elastomer to elastomer ratio is in the range of from 10:90 to 35:65. Photopolymer compositions useful in the practice of this invention include those described in U.S. patent application Ser. No. 10/353,446 filed Jan. 29, 2003, the teachings of which are incorporated herein by reference in their entirety.

The photocurable material also comprises at least one monomer, which should be an ethylenically unsaturated compound. Suitable monomers include multi functional acrylates, multifunctional methacrylates and polyacryloyl oligomers. Examples of suitable monomers include one or more of ethylene glycol diacrylate, hexanediol diacrylate, diethylene glycol diacrylate, glycerol diacrylate, trimethylol propane triacrylate, hexane diol dimethacrylate, glycerol triacrylate, trimethylolpropane triacrylate, ethylene glycol dimethacrylate, 1,3-propanediol dimethacrylate, 1,2,4-butanetriol trimethacrylate, and 1,4-butanediol diacrylate. The photocurable material should also have at least one photoinitiator. Any of the known classes of photoinitiators, particularly free radical photoinitiators such as quinones, bemzophenones, benzoin ethers, aryl ketones, peroxides, biimidazoles, diacyliodoniums, triacylsulfoniums, phosphoniums, and diazoniums. In addition to the binder, monomer, and photoinitiator, the photocurable composition may also comprise other additives known in the art such as plasticizers, antioxidants, oxygen scavengers, flow modifiers, colorants and fillers.

Although the photocurable material noted above is preferred for fabricating the floor layer 14 and the imageable layer 16, any photocurable material useful in fabricating flexographic printing plates may be used. For additional examples of photocurable materials useful in this regard, please refer to U.S. Pat. Nos. 4,045,231; 4,323,636; 5,223,375; and 5,290,633, the teachings each of which are incorporated herein by reference in their entirety. The imageable layer usually ranges from about 15 mil to 35 mil depending on the printing application.

On top of the imageable layer is optionally, but preferably, a masking layer 18. The purpose of the masking layer 18 is to allow for the selective polymerization of the imageable layer. Thus, the masking layer 18 must be made to be removed or become transparent to actinic radiation in areas where the imageable layer 16 is to be polymerized, but at the same time block actinic radiation in areas where the imageable layer is to remain unpolymerized and developed away to create the relief image necessary for flexographic printing. In the alternative, the imageable layer 16 can be selectively exposed to actinic radiation through a negative or a mask as is well known in the art.

Preferably, the masking layer can be selectively ablated using laser radiation in the pattern of the image desired. In the case of laser ablation, the masking layer generally comprises an ultraviolet radiation absorbing material, an infra-red radiation absorbing material and a binder. Dark inorganic pigments such as carbon black or graphite can function as both the ultraviolet radiation absorbing material and infra-red radiation absorbing material. Polyamides or cellulosic polymers are suitable binders. Suitable masking layers are described in U.S. Pat. Nos. 6,605,410 and 6,238,837, the teachings each of which are incorporated herein by reference in their entirety.

The masking layer can be disposed on the imageable layer 16 using several methods. It can be spread directly on the imageable layer 16 and dried. It can be separately spread on a plastic cover sheet and the coversheet laminated to the imageable layer 16 with the masking layer 18 between the imageable layer 16 and the coversheet. In this case, the coversheet is stripped away before use. The masking layer must be removable using the development means used to develop away (remove) the uncured portions of the imageable layer. The masking layer usually ranges from about 1 µm to about 10 µm and having an optical density of from 2.5 to 4.5.

Finally, a removable coversheet may be applied on top of the masking layer to protect the flexographic printing element during handling. If used, the coversheet is removed either just before or just after the selective exposure to actinic radiation.

The printing plate of the invention can be utilized in the following manner:

1. If used, the masking layer 18 is selectively exposed to laser radiation at a wavelength and power such that the portions of masking layer 18 contacted with the laser radiation are ablated away without damaging the underlying imageable layer 16. Preferably the laser is computer controlled to scan the surface of the masking layer 18 according to the image desired. In this regard, please refer to U.S. Pat. No. 5,760,880, the disclosure of which is incorporated herein by reference in its entirety. In the alternative the imageable layer 16 is covered with a negative and is selectively exposed to actinic radiation through the negative as is well known in the art.
2. Next, the surface of the printing plate is exposed to actinic radiation such that the portions of the imaging layer 16 that have been exposed as a result of the ablation of portions of the masking layer 18 above are polymerized, but the portions of the imaging layer 16 that remain covered by the masking layer 18 remain unpolymerized.
3. The printing plate is then subjected to development using heat and/or chemicals such that the masking layer and the unpolymerized portions of the imaging layer are removed leaving behind the polymerized portions of the imaging layer standing out in relief in the image desired. Preferably, the printing plated is subjected to thermal development.
4. Optionally, the printing plate is subjected to further post-curing and detacking the remaining imaging layer using actinic radiation or heat.
5. The printing element is then mounted onto a printing cylinder using conventional means.
6. Finally, the printing element of the invention is mounted in a flexographic printing press to begin printing.

The printing plates of the invention are particularly suited for thermal development. Printing elements of the present invention can be processed down to the cured floor without concern over not removing any uncured photopolymer. This results in a more consistent relief, which is a traditional issue with thermal processing. A higher melt flow top layer can also be formulated without concern for processing issues due to the flow of the partially cured material during processing. This is a concern with dot structure, line structure, and plate to plate registration issues.

Thermal development processes are highly desirable as such processes eliminate the need for chemical processing of printing elements in developing relief images, in order to go from plate to press more quickly. Processes have been developed whereby photopolymer printing plates are prepared using heat and the differential melting temperature between cured and uncured photopolymer is used to develop the latent image. The basic parameters of this process are known, as described in U.S. Pat. Nos. 5,279,697, 5,175,072 and 3,264,103, in published U.S. patent publication Nos. U.S. 2003/0180655, and U.S. 2003/0211423, and in WO 01/88615, WO 01/18604, and EP 1239329, the teachings of each of which are incorporated herein by reference in their entirety.

These processes allow for the elimination of development solvents and the lengthy plate drying times needed to remove the solvent. The speed and efficiency of the process allow for use of the process in the manufacture of flexographic plates for printing newspapers and other publications where quick turnaround times and high productivity are important. In thermal development, the composition of the photopolymer is such that there exists a substantial difference in the melt temperature between the cured and uncured polymer. It is precisely this difference that allows the creation of an image in the photopolymer when heated. The uncured photopolymer (i.e., the portions of the photopolymer not contacted with actinic radiation) will melt or substantially soften while the cured photopolymer will remain solid and intact at the temperature chosen. Thus the difference in melt temperature allows the uncured photopolymer to be selectively removed thereby creating an image.

Example I

The improved printing element of the invention may be prepared as follows:

An epoxy resin and hardener (Ratio approximately 3.3:1) is mixed by hand for 1-2 minutes until it thickens. This resin-hardener mixture is then cast on a suitable substrate as the base layer. Type 106-glass fabric pre-cut into 4-inch width is then coated on the resin-hardener mixture to be sure that the fabric is totally wetted out. The polymer-glass composite is then allowed to crosslink or gel by applying heat for about 30 minutes. The printing element base is then baked for 4 hours at 120° F. After the baking step the printing is further machined or ground to the specified gage (16±½ mil thickness).

A floor layer 16, as set out in Table I, is then extruded onto either the base layer 12 or the compressible layer 14. The floor layer 16 is then cured using either UV actinic radiation or electron beam radiation, and is then ground to the specified gage required for the floor (at least about 20-40 mils thick). The photopolymer imageable layer 18, as set out in Table II is next extruded on top of the floor layer, and is ground to the specific gage required (usually 20-25 mils). A mask layer is further applied on top of the photopolymer using a roller coating operation.

TABLE I

Composition of Floor Layer

| INGREDIENT | WEIGHT % |
|---|---|
| Kraton ® D1102 [1.] | 57.4 |
| Shellflex ® 6371 [2.] | 21.2 |
| HDDA [3.] | 5.30 |
| TMPTMA [4.] | 5.30 |
| Irgacure ® 651 [5.] | 3.30 |
| BHT [6.] | 2.27 |
| Irganox ® 1010 [7.] | 0.03 |
| Calcium Stearate | 0.13 |
| Tinuvin ® 1130 | 0.01 |
| Microspheres | 5.00 |
| | 100.0 |

[1.] Available from Kraton Polymer Company
[2.] Available from Shell Chemical Company
[3.] Hexane dioldiacrylate
[4.] Trimethylolpropane trimethacrylate
[5.] Available from Ciba Specialty Chemicals
[6.] Butyleted hydroxytoluene
[7.] Available from Ciba Specialty Chemicals
[8.] Available from Ciba Specialty Chemicals

TABLE II

Composition of Imageable Layer

| INGREDIENT | WEIGHT % |
|---|---|
| Kraton ® D1102 | 60.46 |
| Shellflex ® 6371 | 22.33 |
| HDDA | 5.58 |
| TMPTMA | 5.58 |
| Irgacure ® 651 | 3.48 |
| BHT | 2.39 |
| Irganox ® 1010 | 0.03 |
| Calcium Stearate | 0.14 |
| Tinuvin ® 1130 | 0.01 |
| | 100.0 |

What is claimed is:

1. A method of doing business between a supplier of planar printing element blanks and a printing plate manufacturer, wherein the supplier supplies a substantially planar printing element blank having at least one layer of uncured photopolymer that is capable of being imagewise exposed and developed to a printing plate manufacturer, and wherein the printing plate manufacturer performs the steps of imagewise exposing and developing the at least one layer of uncured photopolymer to prepare a substantially planar relief image printing plate,
    wherein the printing element blank supplier performs steps comprising:
    a) obtaining from the printing plate manufacturer desired characteristics of the printing element blank selected from the group consisting of thickness, resilience, hardness, durometer, and combinations thereof;
    b) preparing the substantially planar printing element blank according the desired characteristics obtained from the printing plate manufacturer, wherein the printing element blank comprises:
        i) a support layer;
        ii) a pre-cured floor layer comprised of a cured polymer selected from the group consisting of photopolymers and polymers, each with a resilience of at least 40% when cured disposed on the support layer wherein the pre-cured floor layer is sanded, ground, or machined to the thickness characteristic obtained from the printing plate manufacturer within the range of about 5 mils to about 134 mils; and
        iii) at least one layer of an uncured photopolymer disposed on the pre-cured floor layer; and
    c) supplying the planar printing element blank having the pre-cured floor layer to the printing plate manufacturer; and
    wherein the printing plate manufacturer performs steps comprising:
    d) selectively imagewise exposing the layer of uncured photopolymer to actinic radiation to selectively cure portions of the at least one layer of uncured photopolymer, wherein the at least one layer of uncured photopolymer thereafter comprises cured and uncured portions of photopolymer;
    e) developing the printing element blank to remove uncured portions of the photopolymer and reveal the relief image;
    wherein the printing plate manufacturer does not perform a back exposure step.

2. A method according to claim 1, wherein the printing element blank comprises a masking layer on top of the layer of an uncured photopolymer.

3. A method according to claim 1, wherein the printing element blank comprises a removable coversheet on top of the layer of an uncured photopolymer.

4. A method according to claim 2, wherein the printing element blank comprises a removable coversheet on top of the masking layer.

5. A method according to claim 4, wherein the masking layer is selectively ablatable.

6. A method according to claim 1, wherein the pre-cured floor layer also comprises microspheres.

* * * * *

UNITED STATES PATENT AND TRADEMARK OFFICE
CERTIFICATE OF CORRECTION

| | | |
|---|---|---|
| PATENT NO. | : 7,947,427 B2 | Page 1 of 1 |
| APPLICATION NO. | : 12/469721 | |
| DATED | : May 24, 2011 | |
| INVENTOR(S) | : Laurie A. Bryant et al. | |

It is certified that error appears in the above-identified patent and that said Letters Patent is hereby corrected as shown below:

Column 10, Lines 19 through 27, claim 1

DELETE:

", wherein the supplier supplies a substantially planar printing element blank having at least one layer of uncured photopolymer that is capable of being imagewise exposed and developed to a printing plate manufacturer, and wherein the printing plate manufacturer performs the steps of imagewise exposing and developing the at least one layer of uncured photopolymer to prepare a substantially planar relief image printing plate,"

Column 10, Line 34, claim 1

Delete "the substantially planar" and replace it with -- the planar --

Signed and Sealed this
Twelfth Day of July, 2011

David J. Kappos
*Director of the United States Patent and Trademark Office*